US011016545B2

(12) United States Patent
Yang et al.

(10) Patent No.: US 11,016,545 B2
(45) Date of Patent: May 25, 2021

(54) THERMAL THROTTLING FOR MEMORY DEVICES

(71) Applicant: Western Digital Technologies, Inc., San Jose, CA (US)

(72) Inventors: Nian Niles Yang, Mountain View, CA (US); Dmitry Vaysman, San Jose, CA (US); Eran Erez, Bothell, WA (US); Grishma Shah, Milpitas, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 250 days.

(21) Appl. No.: 15/473,044

(22) Filed: Mar. 29, 2017

(65) Prior Publication Data

US 2018/0284857 A1 Oct. 4, 2018

(51) Int. Cl.
*G06F 1/20* (2006.01)
*G11C 16/30* (2006.01)
*G11C 7/04* (2006.01)

(52) U.S. Cl.
CPC ............ *G06F 1/206* (2013.01); *G11C 7/04* (2013.01); *G11C 16/30* (2013.01)

(58) Field of Classification Search
CPC .................................. G06F 1/32; G06F 1/206
See application file for complete search history.

(56) References Cited

U.S. PATENT DOCUMENTS

| 2009/0091996 | A1* | 4/2009 | Chen | ........................ | G11C 7/04 |
| | | | | | 365/212 |
| 2012/0179416 | A1* | 7/2012 | Anderson | ............... | G06F 1/203 |
| | | | | | 702/130 |
| 2013/0275665 | A1* | 10/2013 | Saraswat | .................. | G11C 7/04 |
| | | | | | 711/106 |
| 2014/0281311 | A1* | 9/2014 | Walker | .................. | G06F 3/0604 |
| | | | | | 711/162 |
| 2015/0220278 | A1* | 8/2015 | Sarcone | .................. | G06F 3/061 |
| | | | | | 711/103 |

(Continued)

FOREIGN PATENT DOCUMENTS

| CN | 101587745 A | 11/2009 |
| CN | 101769798 A | 7/2010 |

(Continued)

OTHER PUBLICATIONS

Office Action issued in corresponding Korean Patent Application No. 10-2017-0176271, dated Apr. 26, 2019 (5 pages).

*Primary Examiner* — Kim Huynh
*Assistant Examiner* — Kevin M Stewart
(74) *Attorney, Agent, or Firm* — Patterson & Sheridan, LLP; Steven H. Versteeg (57) ABSTRACT

The present disclosure discloses a memory device including a control system for thermal throttling. The control system acquires the temperature of a non-volatile memory element from a temperature detector at a first frequency. Upon determining that the temperature of the non-volatile memory element is above a pre-determined threshold, the control system acquires the temperature of the non-volatile memory element from the temperature detector at a second frequency that is higher than the first frequency and activates the thermal throttling for the non-volatile memory element.

23 Claims, 5 Drawing Sheets

(56) References Cited

U.S. PATENT DOCUMENTS

| | | | | |
|---|---|---|---|---|
| 2015/0340099 A1* | 11/2015 | Kwak | ................... | G11C 16/34 |
| | | | | 711/103 |
| 2016/0086675 A1* | 3/2016 | Ray | ....................... | G11C 16/26 |
| | | | | 365/185.12 |
| 2019/0004723 A1* | 1/2019 | Li | ........................ | G06F 3/0604 |

FOREIGN PATENT DOCUMENTS

| | | | |
|---|---|---|---|
| CN | 103150235 | A | 6/2013 |
| CN | 103377695 | A | 10/2013 |
| CN | 103514011 | A | 1/2014 |
| JP | 2014-531698 | A | 11/2014 |
| KR | 10-2013-0105899 | A | 9/2013 |

\* cited by examiner

| | 401 | 402 | 403 | 404 | 405 | 406 | 407 |
|---|---|---|---|---|---|---|---|
| | TEMPERATURE RANGE | TEMPERATURE MONITORING FREQUENCY | POWER TOKEN ISSUED PER OPERATION | NAND OPERATING VOLTAGE | NAND OPERATION MODE | NAND CROSS-TEMP CHECK POINT ISSUED | NAND IF DDR SPEED |
| 411 | NORMAL TEMP (-15°C TO 82°C) | FREQUENCY_LOW (1Hz) | NORMAL (USE 100% POWER) | NORMAL $V_{DD}$ | FAST PERFORMANCE (NON-LOCKOUT) | NORMAL PROGRAM Vt DISTRIBUTION | 500MHz |
| 412 | MEDIUM TEMP (83°C TO 90°C) | FREQUENCY_MED (10Hz) | MEDIUM (USE UP TO 85% POWER) | NORMAL $V_{DD}$ | NON-LOCKOUT | NORMAL PROGRAM Vt DISTRIBUTION | 500MHz |
| 413 | HIGH TEMP (91°C TO 100°C) | FREQUENCY_HIGH (100Hz) | LOW (USE UP TO 70% POWER) | NORMAL $V_{DD}$ | LOCKOUT | NORMAL PROGRAM Vt DISTRIBUTION | 400MHz |
| 414 | SUPER HIGH TEMP (ABOVE 100°C) | FREQUENCY_SUPER_HIGH (1000Hz) | SUPER LOW (USE NO MORE THAN 50% POWER) | REDUCED $V_{DD}$ (BY ~ 0.2-0.5V) | LOCKOUT | TIGHTENING THE PROGRAM Vt DISTRIBUTION WITHOUT PERFORMANCE CONCERN | 200MHz |

THERMAL THROTTLING FOR MEMORY DEVICES

BACKGROUND OF THE DISCLOSURE

Field of the Disclosure

Embodiments of the present disclosure generally relate to thermal throttling for memory devices such as solid state drives (SSDs).

Description of the Related Art

Flash memory SSDs have advantages over traditional hard disk drives (HDDs) in that SDDs have a higher throughput, lower read/write latency and lower power consumption. NAND flash memories in particular have a low price and a large capacity compared to other non-volatile memories.

NAND flash memories used in SSD systems experience temperature heating effects, which cause detrimental impacts to the hardware, the system reliability, and the data integrity of the SSD systems. Thermal throttling is used to mitigate the heating effects by controlling the NAND flash memories to generate less heat and cool down.

One approach for thermal throttling is using a single temperature of the SSD system. If the single temperature of the SSD system is higher than a pre-determined threshold, thermal throttling is activated. However, because the rise of the temperature of the SSD system is a gradual event, the aforementioned thermal throttling approach based on a single temperature is not accurate.

Therefore, there is a need for a more efficient and intelligent approach for thermal throttling.

SUMMARY OF THE DISCLOSURE

One embodiment of the present disclosure discloses a memory device including a control system for thermal throttling. The control system is configured to acquire the temperature of a non-volatile memory element from a temperature detector at a first frequency. Upon determining that the temperature of the non-volatile memory element is above a pre-determined threshold, the control system is configured to acquire the temperature of the non-volatile memory element from the temperature detector at a second frequency that is higher than the first frequency and activate the thermal throttling for the non-volatile memory element.

In another embodiment, a memory device comprises a non-volatile memory element configured to process a plurality of read/write operations; a temperature detector configured to measure a temperature of the non-volatile memory element; and a control system in communication with the non-volatile memory element and the temperature detector. The control system is configured to: allocate a first amount of power to the non-volatile memory element; acquire the temperature of the non-volatile memory element from the temperature detector at a first frequency; and upon determining that the temperature of the non-volatile memory element is above a first threshold: acquire the temperature of the non-volatile memory element from the temperature detector at a second frequency, wherein the second frequency is higher than the first frequency; and allocate a second amount of power to the non-volatile memory element, wherein the second amount of power is lower than the first amount of power.

In another embodiment, a memory device comprises a processing means configured to process a plurality of read/write operations; a measuring means configured to measure a temperature of the processing means; a controlling means configured to: allocate a first amount of power to the processing means; acquire the temperature of the processing means at a first frequency; and upon determining that the temperature of the processing means is above a first threshold: acquire the temperature of the processing means from the measuring means at a second frequency, wherein the second frequency is higher than the first frequency; and allocate a second amount of power to the processing means, wherein the second amount of power is lower than the first amount of power.

In another embodiment, a method comprises acquiring the temperature of a non-volatile memory element in a memory device from a temperature detector at a first frequency. The method also comprises, upon determining that the temperature of the non-volatile memory element is above a first threshold, acquiring the temperature of the non-volatile memory element from the temperature detector at a second frequency, wherein the second frequency is higher than the first frequency; and activating thermal throttling for the non-volatile memory element.

In another embodiment, a method comprises measuring a temperature of a NAND die at a first frequency and determining that the temperature is above a first threshold. The method also comprises measuring the temperature of the NAND die at a second threshold and determining that the temperature of the NAND die is below the second threshold. The method further comprises reducing power allocated to the NAND die.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Figure 1:
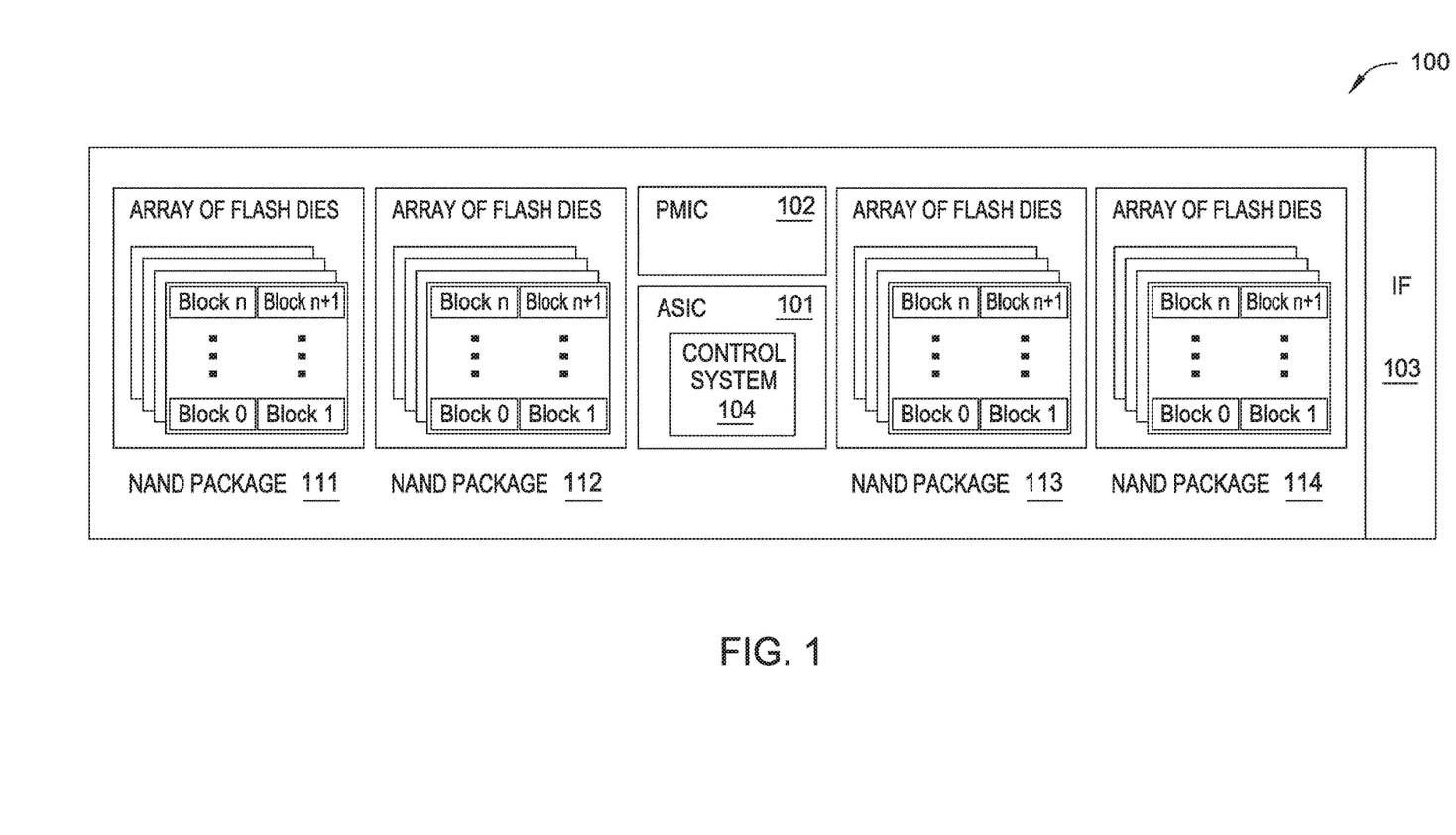
FIG. 1 illustrates a SSD system, according to one embodiment herein.

FIG. 1 illustrates a SSD system 100, according to one embodiment herein. As shown in FIG. 1, the SSD system 100 includes an application-specific integrated circuit (ASIC) 101. The ASIC 101 controls the operations of the SSD system 100. For example, the ASIC 101 controls the I/O operations of memory elements in the SSD system 100 and the communications among different components of the SSD system 100. In one embodiment, the ASIC 101 is mounted on a printed circuit board (PCB) (not shown in FIG. 1). The SSD system 100 also includes a power management integrated circuit (PMIC) 102. In one embodiment, the PMIC 102 monitors and measures power consumption of the SSD system 100. Moreover, the SSD system 100 includes an interface (IF) 103. In one embodiment, the IF 103 is a host interface that communicates data with a host device, e.g., a computer. The SSD system 100 further includes multiple memory elements. As shown in FIG. 1, in one embodiment, the memory elements are NAND packages 111-114. In one embodiment, each of the NAND packages 111-114 includes one or more flash dies, i.e., NAND dies. In one embodiment, each NAND die includes multiple memory cells or blocks, e.g., block 0-block n+1 as shown in FIG. 1.

In one embodiment, the ASIC 101 includes a control system 104. In one embodiment, the control system 104 acquires the temperature of one or more NAND dies of the NAND packages 111-114 at a first frequency. Upon determining that the temperature of the one or more NAND dies is above a pre-determined threshold, the control system 104 acquires the temperature of the one or more NAND dies at a second frequency that is higher than the first frequency. Also, the control system 104 activates the thermal throttling for the one or more NAND dies, which will be described in detail below.

FIG. 1 shows only one embodiment. In other embodiments, the SSD system 100 also includes other components, e.g., system bus and Random Access Memory (RAM), as understood in the art.

Figure 2:
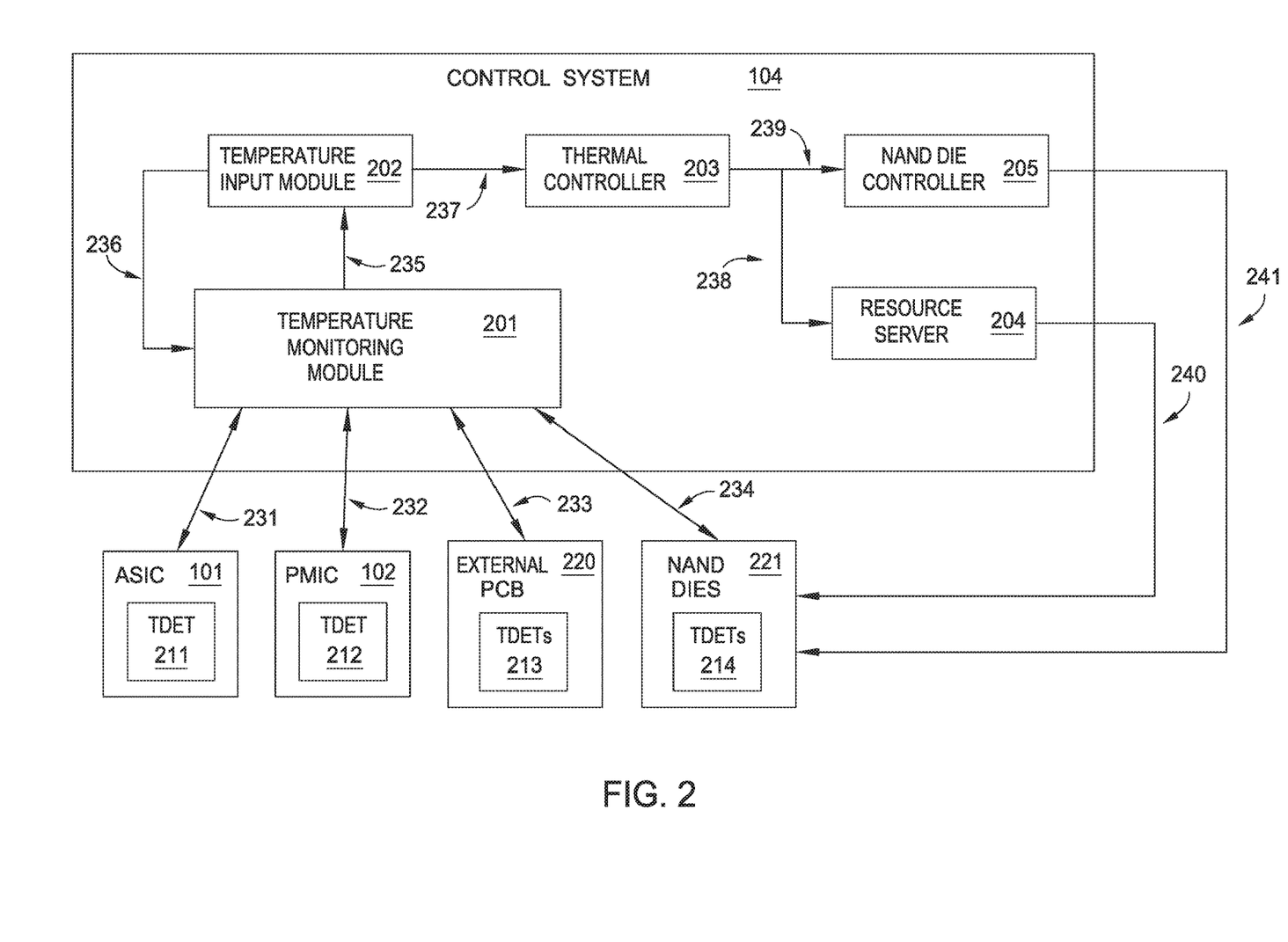
FIG. 2 illustrates a control system for thermal throttling, according to one embodiment herein.

FIG. 2 illustrates the control system 104 for thermal throttling, according to one embodiment herein. As shown in FIG. 2, the control system 104 includes a temperature monitoring module 201. In one embodiment, the temperature monitoring module 201 acquires the temperature of different components of the SSD system 100 through temperature detectors (TDETs) or temperature sensors attached to the components. For example, as shown in FIG. 2, the temperature monitoring module 201 can send a request to the TDET 211 attached to the ASIC 101. In response, the TDET 211 can send the temperature of the ASIC 101 to the temperature monitoring module 201. The communication between the temperature monitoring module 201 and the TDET 211 is indicated by the bi-directional arrow 231 in FIG. 2.

Similarly, as shown in FIG. 2, the temperature monitoring module 201 can send a request to the TDET 212 attached to the PMIC 102 and acquire the temperature of the PMIC 102 from the TDET 212, as indicated by the bi-directional arrow 232. In another example, the SSD system 100 is connected to an external PCB 220, which has multiple attached TEDTs 213. The temperature monitoring module 201 can send requests to the TEDTs 213 and acquire the temperature of the external PCB 220 from the TDETs 213, as indicated by the bi-directional arrow 233. In one embodiment, the TDETs 213 may be mounted at different locations on the external PCB 220.

In another example, the temperature monitoring module 201 can send requests to the TEDTs 214 attached to one or more NAND dies 221 and acquire the temperature of the NAND dies 221 from the TDETs 214, as indicated by the bi-directional arrow 234. The NAND dies 221 are included in one or more of the NAND packages 111-114, as shown in FIG. 1. In one embodiment, each NAND package may have one TDET. In another embodiment, multiple NAND packages may share one TDET. In another embodiment, each NAND package may have multiple TDETs and each of the multiple TDETs measures the temperature of one or more NAND dies in the package.

In one embodiment, the temperature monitoring module 201 acquires the temperatures of the components at a frequency. For example, the temperature monitoring module 201 can acquire the temperature of the NAND dies 221 from the TDETs 214 every 1 second, i.e., at a frequency of 1 Hz. For example, the temperature monitoring module 201 can send requests to the TDETs 214 every 1 second to request the temperature of the NAND dies 221.

After the temperature monitoring module 201 acquires the temperatures of the components of the SSD system 100, the temperature monitoring module 201 provides the acquired temperatures to the temperature input module 202, as indicated by the arrow 235 in FIG. 2. In one embodiment, the temperature monitoring module 201 only provides the acquired temperatures of particular components to the temperature input module 202. For example, the temperature monitoring module 201 may only provide the acquired temperatures of the NAND dies 221 to the temperature input module 202.

In one embodiment, the temperature input module 202 sends feedback information to the temperature monitoring module 201, as indicated by the arrow 236 in FIG. 2. For example, the temperature input module 202 can analyze the temperatures of the components based on regression analysis and feedback a representative temperature of the SSD system 100 to the temperature monitoring module 201. The temperature monitoring module 201 can report the representative temperature to the host device.

The temperature input module 202 provides the temperatures of the components to the thermal controller 203, as indicated by the arrow 237 in FIG. 2. In one embodiment, the thermal controller 203 analyzes and/or evaluates the temperatures of the components and provides instructions to the resource server 204 and the NAND die controller 205 to activate thermal throttling, as indicated by the arrows 238 and 239 in FIG. 2, respectively. For example, the thermal controller 203 can evaluate the temperature of the NAND dies 221. If the thermal controller 203 determines that the temperature of the NAND dies 221 is above a pre-determined threshold, the thermal controller 203 sends instructions to the resource server 204 and the NAND die controller 205 to activate thermal throttling for the NAND dies 221. For example, the thermal controller 203 can instruct the resource server 204 to allocate less power to the NAND dies 221 so that the NAND dies 221 may consume less power. In another example, the thermal controller 203 can instruct the NAND die controller 205 to provide lower operating voltage supply to the NAND dies 221 so that the NAND dies 221 may consume less power.

In one embodiment, the thermal controller 203 uses the temperature of the NAND dies 221 to determine whether to activate thermal throttling for the NAND dies 221 based on a pre-determined threshold. In another embodiment, the thermal controller 203 uses the temperature of the NAND dies 221 as well as the temperatures of other components to determine whether to activate thermal throttling for the NAND dies 221 based on one or more pre-determined thresholds. For example, the thermal controller 203 can use both the temperature of the NAND dies 221 and the temperature of the ASIC 101 to determine whether to activate thermal throttling for the NAND dies 221. For example, if the thermal controller 203 determines that the temperature of the NAND dies 221 and the temperature of the ASIC 101 are both above a threshold, the thermal controller 203 determines to activate thermal throttling for the NAND dies 221. In another example, the temperature threshold for the NAND dies 221 and the temperature threshold for the ASIC 101 can be different thresholds.

After receiving the instructions from the thermal controller 203, the resource server 204 allocates resources to the NAND dies 221 according to the instructions, as indicated by the arrow 240 in FIG. 2. For example, the resource server 204 can allocate less power to the NAND dies 221. Similarly, after receiving the instructions from the thermal controller 203, the NAND die controller 205 controls the operation of the NAND dies 221 according to the instructions, as indicated by the arrow 241 in FIG. 2. For example, the NAND die controller 205 can provide lower operating voltage supply to the NAND dies 221.

Figure 3:
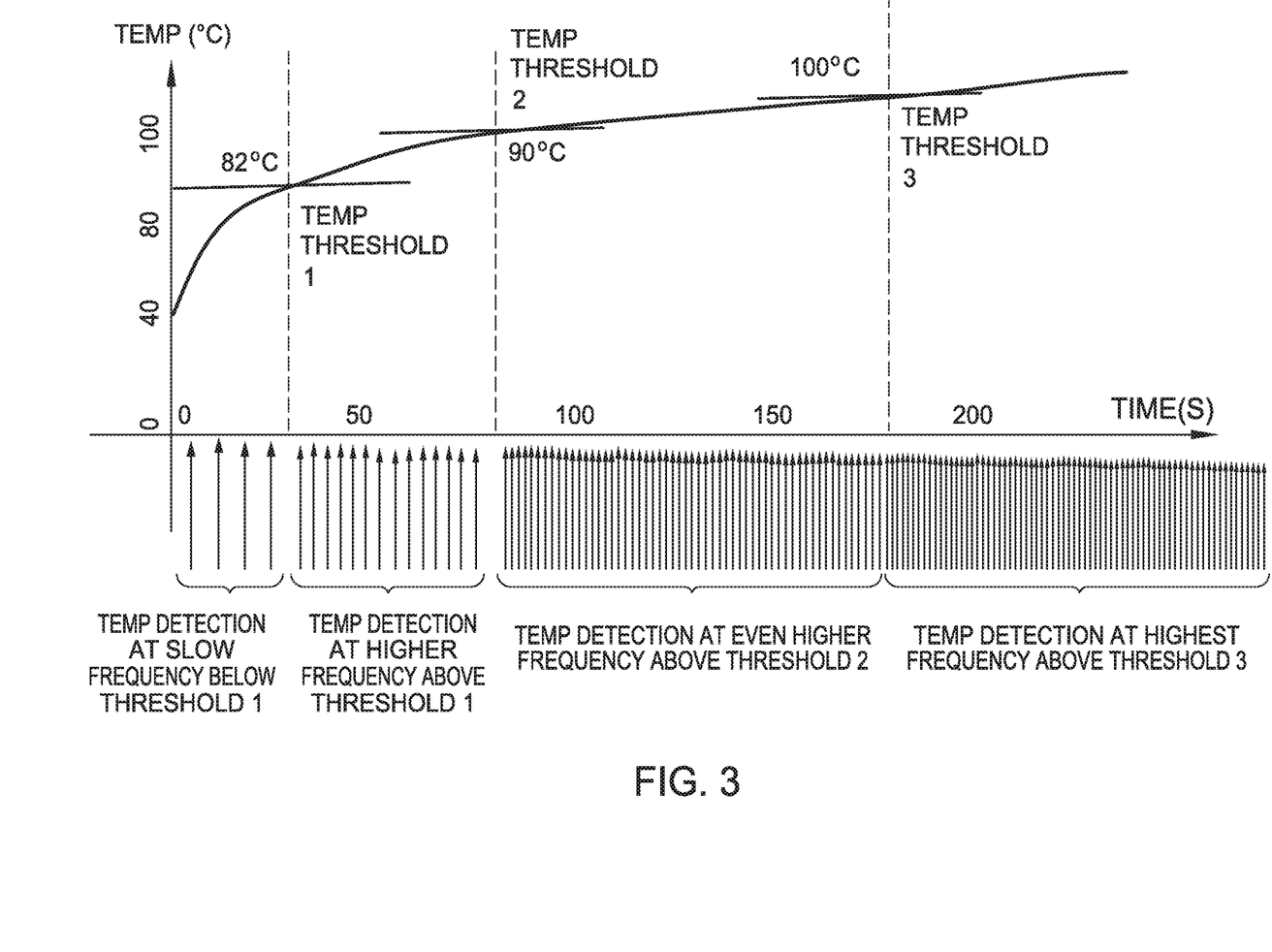
FIG. 3 illustrates temperature detection at different frequencies, according to one embodiment herein.

In one embodiment, the control system 104 performs thermal throttling based on temperature detection at different frequencies, as illustrated in FIG. 3. In FIG. 3, the horizontal axis indicates the time duration (in seconds) of one or more active operations to the NAND dies 221 or the NAND dies in the NAND packages 111-114. For example, the time duration of an active read operation to the NAND dies 221 can last for 300 seconds. The vertical axis indicates the temperature of the SSD system 100 in centigrade (Celsius) degree. In one embodiment, the vertical axis indicates the temperature of the one or more NAND dies 221. In another embodiment, the vertical axis indicates the temperature (e.g., the average temperature) of all the NAND dies in the NAND packages 111-114. In another embodiment, the vertical axis indicates the temperature (e.g., the average temperature) of multiple components of the SSD system 100, e.g. the NAND dies 221 and the ASIC 101.

It is assumed that in one example, the vertical axis indicates the temperature of the one or more NAND dies 221. As shown in FIG. 3, the rise of the temperature of the NAND dies 221 is gradual during the time period of the active operation of the NAND dies 221. For example, at the beginning of the active read operation (at 0 second), the temperature of NAND dies 221 is around 40 degrees centigrade. After 200 seconds of active read operation, the temperature of NAND dies 221 is gradually increased to around 105 degrees centigrade.

In one embodiment, the temperature monitoring module 201 acquires the temperature of the NAND dies 221 at different frequencies. For example, as shown in FIG. 3, when the temperature of the NAND dies 221 is below the temperature threshold 1, e.g., 82 degrees centigrade, the temperature monitoring module 201 acquires the temperature of the NAND dies 221 at a slow frequency, e.g., 1 Hz. In one embodiment, the temperature below the temperature threshold 1 is considered as a normal temperature of the NAND dies 221.

After a first time period of the active operation, e.g., from 0-40 seconds, the temperature of the NAND dies 221 gradually rises above the temperature threshold 1. In this case, the temperature monitoring module 201 acquires the temperature of the NAND dies 221 at a higher frequency, e.g., 10 Hz. In other words, the temperature monitoring module 201 acquires the temperature of the NAND dies 221 every 0.1 seconds.

After a second time period of the active operation, e.g., from 40-80 seconds, the temperature of the NAND dies 221 continues to rise above a temperature threshold 2, e.g., 90 degrees centigrade. In this case, the temperature monitoring module 201 acquires the temperature of the NAND dies 221 at an even higher frequency, e.g., 100 Hz. In other words, the temperature monitoring module 201 acquires the temperature of the NAND dies 221 every 0.01 seconds.

After a third time period of the active operation, e.g., from 80-180 seconds, the temperature of the NAND dies 221 continues to rise above a temperature threshold 3, e.g., 100 degrees centigrade. In this case, the temperature monitoring module 201 acquires the temperature of the NAND dies 221 at the highest frequency, e.g., 1000 Hz. In other words, the temperature monitoring module 201 acquires the temperature of the NAND dies 221 every 0.001 seconds.

In one embodiment, the three temperature thresholds are pre-determined thresholds. As described above, the temperature monitoring module 201 acquires the temperature of the NAND dies 221 at higher frequencies when the temperature of the NAND dies 221 gradually increases. In one embodiment, when the temperature of the NAND dies 221 rises above the temperature threshold 1, e.g., 82 degrees centigrade, the control system 104 activates the thermal throttling for the NAND dies 221. In one embodiment, the thermal controller 203 sends different instructions to the resource server 204 and the NAND die controller 205 when the temperature of the NAND dies 221 is in different temperature ranges, as described in detail below.

FIG. 3 shows only one embodiment. In other embodiments, the temperature monitoring module 201 acquires the temperature of the SSD system 100 or temperature of the components of the SSD system 100 at different frequencies. In other embodiments, the temperature thresholds have temperature different values. In other embodiments, there can be more than three temperature thresholds during the active operation.

Figure 4:
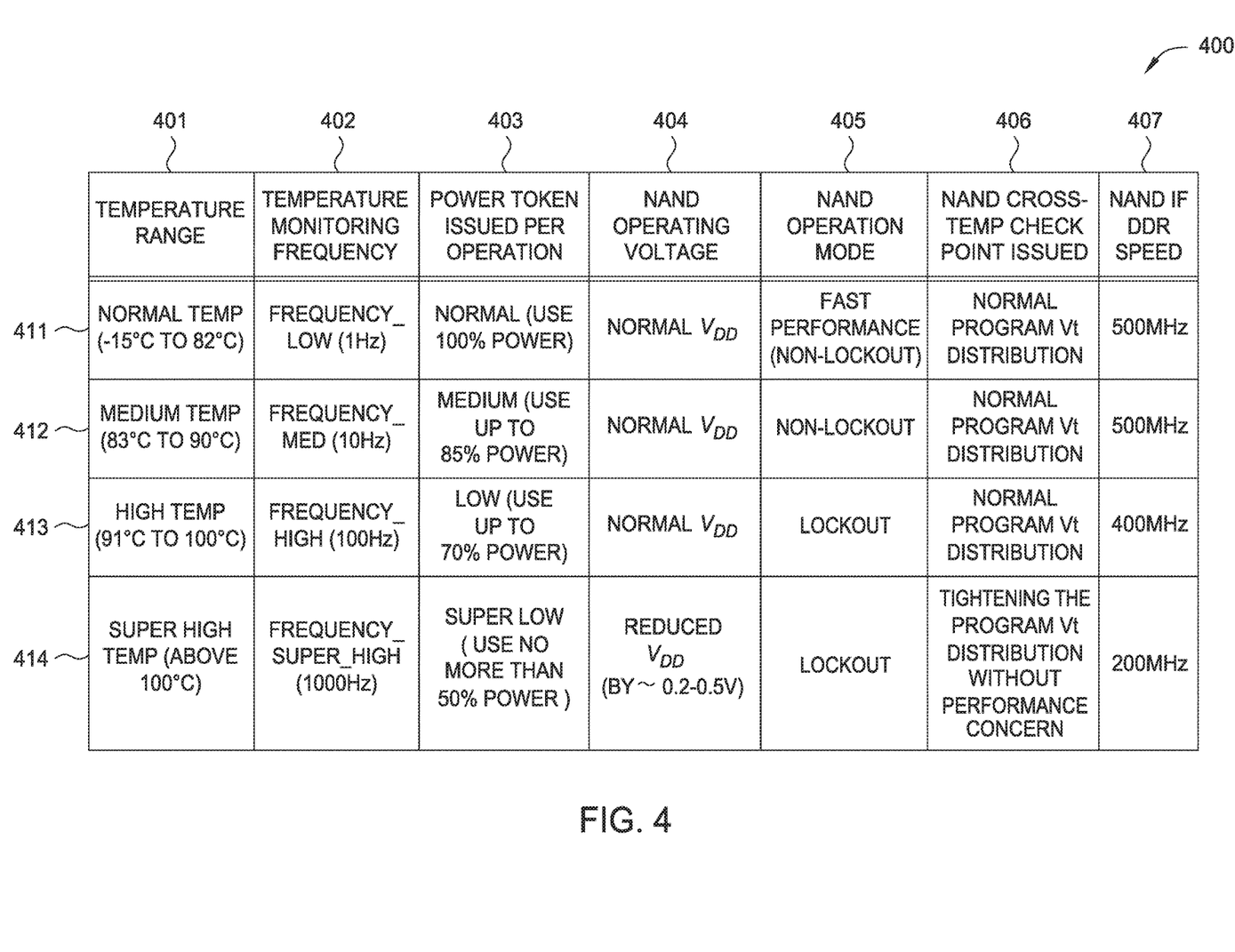
FIG. 4 illustrates a look-up table for thermal throttling, according to one embodiment herein.

FIG. 4 illustrates a look-up table 400 for thermal throttling, according to one embodiment herein. The look-up table 400 includes seven columns 401-407 and four rows 411-414. Column 401 includes the temperature range of the SSD system 100 for the NAND dies in the NAND packages 111-114. Column 402 includes the temperature monitoring frequency by the temperature monitoring module 201. Column 403 includes the power token issued per operation to the NAND dies by the resource server 204. Columns 404-407 include the operations of the NAND dies controlled by the NAND die controller 205. Specifically, column 404 includes the operating voltage supplied to the NAND dies.

Column 405 includes the NAND operation mode. Column 406 includes the cross-temperature check point issued to the NAND dies. Column 407 includes the interface (IF) DDR speed of the NAND dies.

In the description below, it is assumed that column 401 of the look-up table 400 includes the temperature range of the NAND dies 221. In other embodiments, column 401 of the look-up table 400 can include the temperature range of multiple components of the SSD system 100, e.g. the NAND dies 221 and the ASIC 101.

In one embodiment, when the temperature of the NAND dies 221 is within the normal temperature range (e.g., −15-82 degrees centigrade as shown in row 411 and column 401), the temperature monitoring module 201 acquires the temperature of the NAND dies 221 at a low frequency, e.g., 1 Hz, as shown in row 411 and column 402 and as described above. Because the temperature of the NAND dies 221 is within the normal range, thermal throttling for the NAND dies 221 is not activated. The thermal controller 203 instructs the resource server 204 to issue normal power tokens, i.e., allocate normal power, to the NAND dies 221. For example, the thermal controller 203 can instruct the resource server 204 to allocate 100% of the power budget to the NAND dies 221, as shown in row 411 and column 403. In another example, the thermal controller 203 can instruct the resource server 204 to maintain the data traffic on the NAND dies 221. Also, the thermal controller 203 instructs the NAND die controller 205 to control the NAND dies 221 operating normally. For examples, the thermal controller 203 can instruct the NAND die controller 205 to provide normal operating voltage $V_{DD}$ to the NAND dies 221, as shown in row 411 and column 404. The thermal controller 203 can instruct the NAND die controller 205 to control the NAND dies 221 to operate in a non-lockout mode with fast performance, as shown in row 411 and column 405. The thermal controller 203 can instruct the NAND die controller 205 to issue normal cross-temperature check point to the NAND dies 221 with normal program Vt distribution, as shown in row 411 and column 406. The thermal controller 203 can instruct the NAND die controller 205 to control the NAND dies 221 to operate at a high interface DDR speed, e.g., 500 MHz, as shown in row 411 and column 407.

In one embodiment, when the temperature of the NAND dies 221 rises to a temperature within the medium temperature range (e.g., 83-90 degrees centigrade as shown in row 412 and column 401), the thermal controller 203 can label or mark the NAND dies 221 as aggressors. The temperature monitoring module 201 acquires the temperature of the NAND dies 221 at a medium frequency, e.g., 10 Hz, as shown in row 412 and column 402 and as described above. After the temperature of the NAND dies 221 rises to a temperature within the medium temperature range, thermal throttling for the NAND dies 221 is activated by the thermal controller 203. For example, the thermal controller 203 instructs the resource server 204 to issue less power tokens, i.e., allocate medium power, to the NAND dies 221. For example, the thermal controller 203 can instruct the resource server 204 to allocate up to 85% of the power budget to the NAND dies 221, as shown in row 412 and column 403. In another example, the thermal controller 203 can instruct the resource server 204 to reduce the data traffic, e.g., by 15%, on the NAND dies 221. In one embodiment, even the temperature of the NAND dies 221 rises to a temperature within the medium temperature range, the thermal controller 203 still instructs the NAND die controller 205 to control the NAND dies 221 operating normally. For examples, the thermal controller 203 can instruct the NAND die controller 205 to provide normal operating voltage $V_{DD}$ to the NAND dies 221, as shown in row 412 and column 404. The thermal controller 203 can instruct the NAND die controller 205 to control the NAND dies 221 to operate in a non-lockout mode (may not be fast-performance), as shown in row 412 and column 405. The thermal controller 203 can instruct the NAND die controller 205 to issue normal cross-temperature check point to the NAND dies 221 with normal program Vt distribution, as shown in row 412 and column 406. The thermal controller 203 can instruct the NAND die controller 205 to control the NAND dies 221 to operate at a high interface DDR speed, e.g., 500 MHz, as shown in row 412 and column 407.

In one embodiment, when the temperature of the NAND dies 221 continues to rise to a temperature within the high temperature range (e.g., 91-100 degrees centigrade as shown in row 413 and column 401), the temperature monitoring module 201 acquires the temperature of the NAND dies 221 at a high frequency, e.g., 100 Hz, as shown in row 413 and column 402 and as described above. After the temperature of the NAND dies 221 rises to a temperature within the high temperature range, the thermal controller performs a higher level of thermal throttling to control the NAND dies 221 to generate less heat and cool down faster. For example, the thermal controller 203 instructs the resource server 204 to issue lesser power tokens, i.e., allocate low power, to the NAND dies 221. For example, the thermal controller 203 can instruct the resource server 204 to allocate up to 70% of the power budget to the NAND dies 221, as shown in row 413 and column 403. In another example, the thermal controller 203 can instruct the resource server 204 to further reduce the data traffic, e.g., by 30%, on the NAND dies 221. In one embodiment, the thermal controller 203 also instructs the NAND die controller 205 to control the NAND dies 221 to consume less power. For examples, the thermal controller 203 can instruct the NAND die controller 205 to control the NAND dies 221 to operate in a lock-out mode, as shown in row 413 and column 405. In one embodiment, in the lock-out mode, some or part of the NAND dies 221 do not involve in the active operations and are locked out from further programing. Also, the thermal controller 203 can instruct the NAND die controller 205 to control the NAND dies 221 to operate at a lower interface DDR speed to access the NAND dies 221, e.g., 400 MHz, as shown in row 413 and column 407. With the higher level of thermal throttling, the NAND dies 221 consumes less power and generates less heat to lower the temperature faster.

In one embodiment, when the temperature of the NAND dies 221 continues to rise to a temperature within the super high temperature range (e.g., above 100 degrees centigrade as shown in row 414 and column 401) due to the long active operation(s), the temperature monitoring module 201 acquires the temperature of the NAND dies 221 at a super high frequency, e.g., 1000 Hz, as shown in row 414 and column 402 and as described above. After the temperature of the NAND dies 221 rises to a temperature within the super high temperature range, the thermal controller performs the highest level of thermal throttling to control the NAND dies 221. For example, the thermal controller 203 instructs the resource server 204 to issue the least power tokens, i.e., allocate super low power, to the NAND dies 221. For example, the thermal controller 203 can instruct the resource server 204 to allocate no more than 50% of the power budget to the NAND dies 221, as shown in row 413 and column 403. In another example, the thermal controller 203 can instruct the resource server 204 to further reduce the data traffic, e.g., by 50%, on the NAND dies 221. In one embodiment, the thermal controller 203 also instructs the NAND die controller 205 to control the NAND dies 221 to consume the least power. For examples, the thermal controller 203 can instruct the NAND die controller 205 to provide lower operating voltage $V_{DD}$ (e.g., reduce the $V_{DD}$ by 0.2-0.5 V) to the NAND dies 221, as shown in row 414 and column 404. Also, the thermal controller 203 can instruct the NAND die controller 205 to control the NAND dies 221 to continue to operate in the lock-out mode, as shown in row 414 and column 405. Moreover, the thermal controller 203 can instruct the NAND die controller 205 to issue the cross-temperature check point to the NAND dies 221 by tightening the program Vt distribution during the program operation, so that the SSD system 100 is better adjusted for cross-temperature read and/or write operations to the NAND dies 221 without considering the impact to the performance, as shown in row 414 and column 406. In one embodiment, tightening the program Vt distribution for cross-temperature read and/or write operations to the NAND dies 221 can compensate future temperature cross effect caused by future low temperature read or write operations. Further, the thermal controller 203 can instruct the NAND die controller 205 to control the NAND dies 221 to operate at an even lower interface DDR speed, e.g., 200 MHz, as shown in row 414 and column 407. With the highest level of thermal throttling, the NAND dies 221 consumes the least power and generates the least heat.

In one embodiment, after the thermal controller 203 activates the thermal throttling for the NAND dies 221, the temperature of the NAND dies 221 is reduced gradually to the normal temperature range. In one embodiment, the thermal controller 203 can label or mark the NAND dies 221 with reduced temperature as normal NAND dies. In one embodiment, the temperature monitoring module 201 can acquire the temperature of the NAND dies 221 at a lower frequency corresponding to the reduced temperature of the NAND dies 221. In one embodiment, the thermal controller 203 can instruct the resource server 204 to issue more power tokens (allocate more power) or increase the data traffic, to the NAND dies 221 that have a reduced temperature. In one embodiment, the thermal controller 203 can instruct the NAND die controller 205 to control the NAND dies 221 to operate normally, e.g., in a non-lockout mode. Generally, the thermal controller 203 can instruct the resource server 204 and the NAND die controller 205 to control the NAND dies 221 to operate according to the current temperature of the NAND dies 221.

FIG. 4 shows only one embodiment. In other embodiments, the look-up table 400 may include different variations. For example, when the temperature of the NAND dies 221 rises to a temperature within the high temperature range (row 413), the thermal controller 203 can send some or all the instructions listed in row 404 to the resource server 204 and the NAND die controller 205, as when the temperature of the NAND dies 221 rises to a temperature within the super high temperature range.

Figure 5:
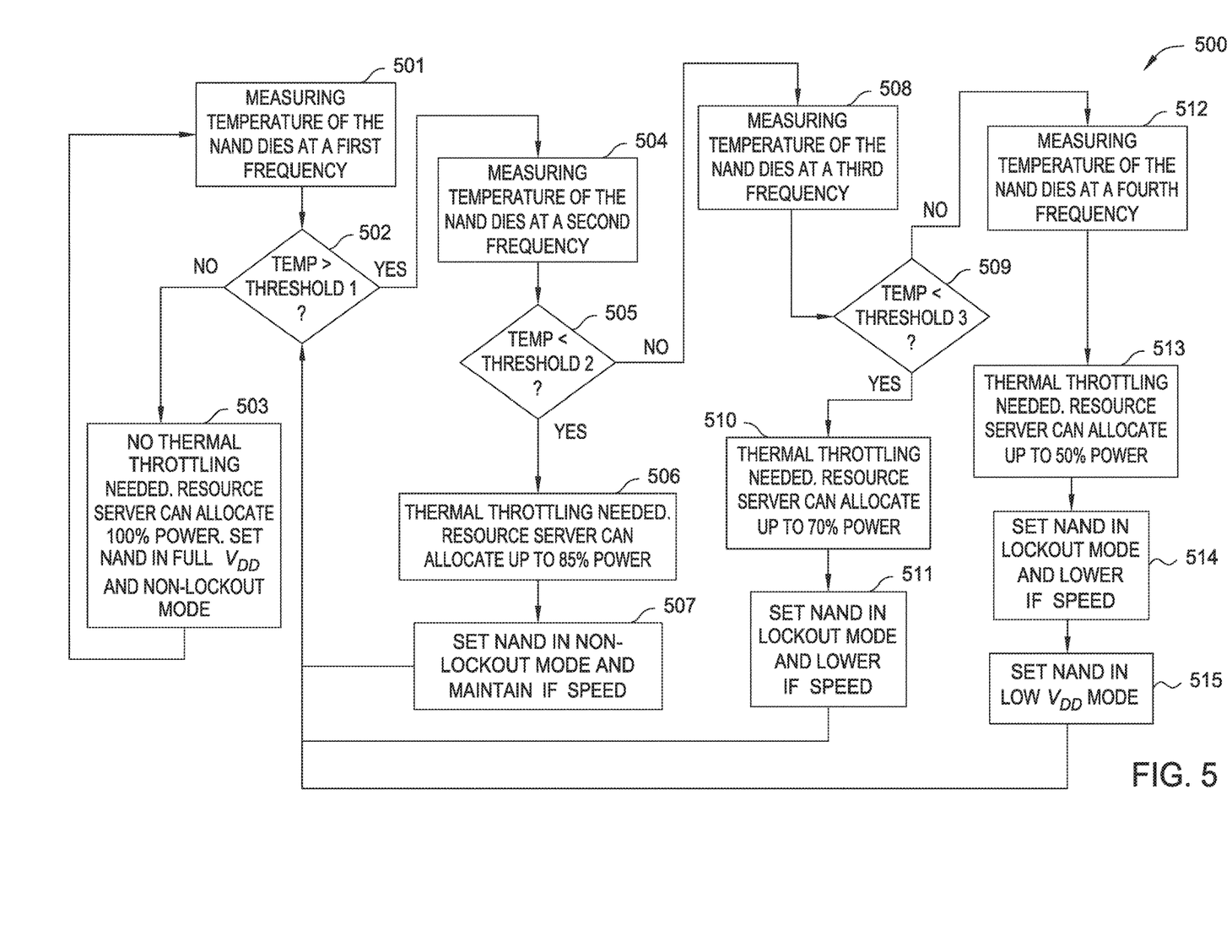
FIG. 5 illustrates a flowchart showing a method for thermal throttling, according to one embodiment herein.

FIG. 5 illustrates a flowchart showing a method 500 for thermal throttling, according to one embodiment herein. In one embodiment as described below, the control system 104 implements the method 500 during one or more active operations of the NAND dies 221.

At block 501, the temperature monitoring module 201 measures the temperature of the NAND dies 221 at a first frequency, e.g., 1 Hz. At block 502, the temperature monitoring module 201 and/or the thermal controller 203 determines whether the measure temperature of the NAND dies 221 is above a first temperature threshold, e.g., 82 degrees centigrade. If the answer at block 502 is "NO", the method 500 proceeds to block 503. At block 503, the thermal controller 203 determines that the NAND dies 221 are operating in the normal temperature range and thus thermal throttling for the NAND dies 221 is not needed. At block 503, the thermal controller 203 can instruct the resource server 204 to allocate 100% power to the NAND dies 221 and instruct the NAND die controller 205 to set the NAND dies 221 in full or normal $V_{DD}$ mode and non-lockout mode. The method 500 proceeds back to block 501 to continue measuring the temperature of the NAND dies 221 at the first frequency.

If the answer at block 502 is "YES", the method 500 proceeds to block 504. At block 504, the temperature monitoring module 201 measures the temperature of the NAND dies 221 at a second frequency, e.g., 10 Hz. At block 505, the temperature monitoring module 201 and/or the thermal controller 203 determines whether the measure temperature of the NAND dies 221 is below a second temperature threshold, e.g., 90 degrees centigrade.

If the answer at block 505 is "YES", the method 500 proceeds to block 506. At block 506, the thermal controller 203 determines that thermal throttling for the NAND dies 221 needs to be activated. At block 506, the thermal controller 203 can instruct the resource server 204 to allocate up to 85% power to the NAND dies 221. At block 507, the thermal controller 203 can instruct the NAND die controller 205 to set the NAND dies 221 in non-lockout mode and maintain the IF speed, e.g., 500 MHz. With thermal throttling, the temperature of the NAND dies 221 can be reduced, thus, after block 507, the method 500 proceeds back to block 502 to determine whether thermal throttling is still needed.

If the answer at block 505 is "NO", the method 500 proceeds to block 508. At block 508, the temperature monitoring module 201 measures the temperature of the NAND dies 221 at a third frequency, e.g., 100 Hz. At block 509, the temperature monitoring module 201 and/or the thermal controller 203 determines whether the measure temperature of the NAND dies 221 is below a third temperature threshold, e.g., 100 degrees centigrade.

If the answer at block 509 is "YES", the method 500 proceeds to block 510. At block 510, the thermal controller 203 determines that thermal throttling for the NAND dies 221 is still needed. At block 510, the thermal controller 203 can instruct the resource server 204 to allocate up to 70% power to the NAND dies 221. At block 511, the thermal controller 203 can instruct the NAND die controller 205 to set the NAND dies 221 in lock-out mode and lower the IF speed, e.g. from 500 MHz to 400 MHz. With thermal throttling, the temperature of the NAND dies 221 can be reduced, thus, after block 511, the method 500 proceeds back to block 502 to determine whether thermal throttling is still needed.

If the answer at block 509 is "NO", the method 500 proceeds to block 512. At block 512, the temperature monitoring module 201 measures the temperature of the NAND dies 221 at a fourth frequency, e.g., 1000 Hz. At block 513, the thermal controller 203 determines that thermal throttling for the NAND dies 221 is still needed. The thermal controller 203 can instruct the resource server 204 to allocate up to 50% power to the NAND dies 221.

At block 514, the thermal controller 203 can instruct the NAND die controller 205 to set the NAND dies 221 in lock-out mode and lower the IF speed, e.g. from 400 MHz to 200 MHz. At block 515, thermal controller 203 can instruct the NAND die controller 205 to set the NAND dies 221 in low $V_{DD}$ mode, e.g., provide a reduced $V_{DD}$ to the NAND dies 221. With thermal throttling, the temperature of the NAND dies 221 can be reduced, thus, after block 515, the method 500 proceeds back to block 502 to determine whether thermal throttling is still needed.

FIG. 5 shows only one embodiment. In other embodiments, the thermal controller 203 can send different instructions to the resource server 204 and the NAND die controller 205 to perform thermal throttling. For example, the thermal controller 203 can instruct the resource server 204 to reduce the data traffic on the NAND dies 221 at blocks 506, 510 and/or 513. In another example, the thermal controller 203 can instruct the NAND die controller 205 to tighten the program Vt distribution for cross-temperature read/write operations to the NAND dies 221 at blocks 514 or 515.

By intelligently monitoring the temperature, a system's data reliability is improved. Specifically, when the temperature exceeds a threshold, the performance of the NAND is slowed. By slowing the NAND, the temperature will decrease. Once decreased below the threshold, the NAND can again operate at full performance levels.

While the foregoing is directed to embodiments of the present disclosure, other and further embodiments of the disclosure may be devised without departing from the basic scope thereof, and the scope thereof is determined by the claims that follow.

What is claimed is:

1. A memory device, comprising: a non-volatile memory element configured to process a plurality of read/write operations; a temperature detector configured to: measure a temperature of the non-volatile memory element; measure a temperature of an application-specific integrated circuit (ASIC); measure a temperature of a power management integrated circuit (PMIC); and measure a temperature of a printed circuit board (PCB); and a control system in communication with the non-volatile memory element, the ASIC, the PMIC, the PCB, and the temperature detector, wherein the control system is configured to: allocate a first amount of power to the non-volatile memory element; acquire the temperature of the non-volatile memory element, the temperature of the ASIC, the temperature of the PMIC, and the temperature of the PCB from the temperature detector at a first frequency; and upon determining that the temperature of the non-volatile memory element and at least one of the temperature of the ASIC, the temperature of the PMIC, or the temperature of the PCB is above a first threshold: acquire the temperature of the non-volatile memory element, the temperature of the ASIC, the temperature of the PMIC, and the temperature of the PCB from the temperature detector at a second frequency, wherein the second frequency is higher than the first frequency such that temperature is measured more often than at the first frequency; allocate a second amount of power to the non-volatile memory element, wherein the second amount of power is lower than the first amount of power; and tighten a voltage distribution during a program operation, such that the memory device is better adjusted for a cross-temperature read operation to the non-volatile memory element.

2. The memory device of claim 1, wherein the control system is further configured to:
   upon determining that the temperature of the non-volatile memory element is above the first threshold, control the non-volatile memory element to lock-out at least some of a plurality of NAND die of the non-volatile memory element.

3. The memory device of claim 1, wherein the second amount of power to the non-volatile memory element is allocated per each of the plurality of read/write operations.

4. The memory device of claim 1, further comprising a temperature detector configured to measure a temperature of the ASIC configured to control input/output (I/O) operations to the non-volatile memory element, the control system further configured to determine whether the temperature of the ASIC is above a second threshold.

5. A memory device, comprising: a non-volatile processing means configured to process a plurality of read/write operations; a measuring means configured to: measure a temperature of the non-volatile processing means; measure a temperature of an application-specific integrated circuit (ASIC); measure a temperature of a power management integrated circuit (PMIC); and measure a temperature of a printed circuit board (PCB); and a controlling means configured to: allocate a first amount of power to the non-volatile processing means acquire the temperature of the non-volatile processing means, the temperature of the ASIC, the temperature of the PMIC, and the temperature of the PCB at a first frequency; and upon determining that the temperature of the non-volatile processing means and at least one of the temperature of the ASIC, the temperature of the PMIC, or the temperature of the PCB is above a first threshold: acquire the temperature of the non-volatile processing means, the temperature of the ASIC, the temperature of the PMIC, and the temperature of the PCB from the measuring means at a second frequency, wherein the second frequency is higher than the first frequency such that temperature is measured more often than at the first frequency; allocate a second amount of power to the non-volatile processing means, wherein the second amount of power is lower than the first amount of power: control the non-volatile processing means to operate at a lower interface speed to access; and tighten a voltage distribution during a program operation of the non-volatile processing means, such that the memory device is better adjusted for a cross-temperature read operation to the non-volatile processing means.

6. The memory device of claim 5, wherein the memory device comprises a Solid State Drive (SSD).

7. The memory device of claim 5, wherein the non-volatile processing means comprises one or more NAND dies.

8. The memory device of claim 7, wherein the controlling means is further configured to:
   upon determining that the temperature of the non-volatile processing means is above the threshold, control the non-volatile processing means to lock-out at least part of the one or more NAND dies.

9. The memory device of claim 5, wherein the second amount of power to the non-volatile processing means is allocated per each of the plurality of read/write operations.

10. The memory device of claim 5, further comprising a measuring means configured to measure a temperature of the ASIC configured to control input/output (I/O) operations to the non-volatile processing means, the controlling means further configured to determine whether the temperature of the ASIC is above a second threshold.

11. A method, comprising: acquiring a temperature of a non-volatile memory element, a temperature of an application-specific integrated circuit (ASIC), a temperature of a power management integrated circuit (PMIC), and a temperature of a printed circuit board (PCB) in a memory device from a temperature detector at a first frequency; and upon determining that the temperature of the non-volatile memory element and at least one of the temperature of the ASIC, the temperature of the PMIC, or the temperature of the PCB is above a first threshold: allocating a first amount of power to the non-volatile memory element; acquiring the temperature of the non-volatile memory element, the temperature of the ASIC, the temperature of the PMIC, and the temperature of the PCB from the temperature detector at a second frequency, wherein the second frequency is higher than the first frequency such that temperature is measured more often than at the first frequency: allocating a second amount of power to the non-volatile memory element, wherein the second amount of power is lower than the first amount of power; and activating thermal throttling for the non-volatile memory element, the active thermal throttling comprising: controlling the non-volatile memory element to operate at a lower interface speed to access the non-volatile memory element; and tightening a voltage distribution during a program operation, such that the memory device is better adjusted for a cross-temperature read operations to the non-volatile memory element.

12. The method of claim 11, wherein the activating thermal throttling for the non-volatile memory element further comprises performing one or more of:
allocating a less amount of power to the non-volatile memory element;
allocating less data traffic to the non-volatile memory element;
controlling the non-volatile memory element to operate in a lock-out mode; and
reducing an operating voltage supply to the non-volatile memory element.

13. The method of claim 11, further comprising:
determining that the temperature of the non-volatile memory element and at least one of the temperature of the ASIC, the temperature of the PMIC, or the temperature of h PCB has exceeded a second threshold; and
allocating a less amount of power to the non-volatile memory element.

14. The method of claim 13, further comprising:
determining that the temperature of the non-volatile memory element and at least one of the temperature of the ASIC, the temperature of the PMIC, or the temperature of h PCB has exceeded a third threshold; and
allocating a less amount of power to the non-volatile memory element.

15. The method of claim 14, further comprising acquiring the temperature of the non-volatile memory element and at least one of the temperature of the ASIC, the temperature of the PMIC, or the temperature of the PCB multiple times, wherein the temperature of the non-volatile memory element and at least one of the temperature of the ASIC, the temperature of the PMIC, or the temperature of the PCB is acquired every second.

16. The method of claim 15, wherein once the temperature of the non-volatile memory element and at least one of the temperature of the ASIC, the temperature of the PMIC, or the temperature of the PCB is determined to be above the first threshold, the temperature of the non-volatile memory element and at least one of the temperature of the ASIC, the temperature of the PMIC, or the temperature of the PCB is acquired every 0.1 seconds.

17. The method of claim 16, wherein once the temperature of the non-volatile memory element and at least one of the temperature of the ASIC, the temperature of the PMIC, or the temperature of the PCB is determined to be above the second threshold, the temperature of the non-volatile memory element and at least one of the temperature of the ASIC, the temperature of the PMIC, or the temperature of the PCB is acquired every 0.01 seconds.

18. The method of claim 17, wherein once the temperature of the non-volatile memory element and at least one of the temperature of the ASIC, the temperature of the PMIC, or the temperature of the PCB is determined to be above the third threshold, the temperature of the non-volatile memory element and at least one of the temperature of the ASIC, the temperature of the PMIC, or the temperature of the PCB is acquired every 0.001 seconds.

19. The method of claim 11, further comprising:
determining that the temperature of the non-volatile memory element and at least one of the temperature of the ASIC, the temperature of the PMIC, or the temperature of h PCB has lowered to below the first threshold; and
operating the non-volatile memory element in full power mode.

20. The method of claim 11, further comprising:
acquiring a temperature of the ASIC configured to control input/output (I/O) operations to the non-volatile memory element; and
determining whether the temperature of the ASIC is above a second threshold.

21. A memory device, comprising: a non-volatile memory element configured to process a plurality of read/write operations; a temperature detector configured to: measure a temperature of the non-volatile memory element; measure a temperature of an application-specific integrated circuit (ASIC); measure a temperature of a power management integrated circuit (PMC); and measure a temperature of a printed circuit board (PCB); and a control system in communication with the non-volatile memory element, the ASIC, the PMIC, the PCB, and the temperature detector, wherein the control system is configured to: acquire the temperature of the non-volatile memory element, the temperature of the ASIC, the temperature of the PMIC, and the temperature of the PCB from the temperature detector at a first frequency; and upon determining that the temperature of the non-volatile memory element and at least one of the temperature of the ASIC, the temperature of the PMIC, or the temperature of the PCB is above one of a plurality of thresholds: acquire the temperature of the non-volatile memory element, the temperature of the ASIC, the temperature of the PMIC, and the temperature of the PCB from the temperature detector at a second frequency, wherein the second frequency is higher than the first frequency such that temperature is measured more often than at the first frequency; reduce an operating voltage supply to the non-volatile memory element; control the non-volatile memory element to operate at a lower interface speed to access the non-volatile memory element; and activate thermal throttling for the non-volatile memory element by tightening a voltage distribution during a program operation, such that the memory device is better adjusted for a cross-temperature read operation to the non-volatile memo element.

22. The memory device of claim 21, wherein the control system is configured to activate thermal throttling for the non-volatile memory element by further performing one or more of:
allocating a less amount of power to the non-volatile memory element;
allocating less data traffic to the non-volatile memory element; and
controlling the non-volatile memory element to operate in a lock-out mode.

23. The memory device of claim 21, further comprising a temperature detector configured to measure a temperature of the ASIC configured to control input/output (I/O) operations to the non-volatile memory element, the control system further configured to determine whether the temperature of the ASIC is above a second threshold.

* * * * *